United States Patent
Ban et al.

(10) Patent No.: US 7,550,362 B2
(45) Date of Patent: Jun. 23, 2009

(54) METHOD FOR MANUFACTURING SEMICONDUCTOR DEVICE

(75) Inventors: Keun Do Ban, Yongin-si (KR); Cheol Kyu Bok, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 195 days.

(21) Appl. No.: 11/482,135

(22) Filed: Jul. 5, 2006

(65) Prior Publication Data

US 2007/0155114 A1    Jul. 5, 2007

(30) Foreign Application Priority Data

Dec. 30, 2005    (KR) .................. 10-2005-0135355

(51) Int. Cl.
*H01L 21/76* (2006.01)
(52) U.S. Cl. .................. 438/401; 438/253; 438/396; 257/E21.019; 257/E21.648
(58) Field of Classification Search ............. 438/253, 438/396, 401; 257/E21.019, E21.648
See application file for complete search history.

(56) References Cited

U.S. PATENT DOCUMENTS

2005/0214694 A1    9/2005    Hong et al.
2005/0287738 A1    12/2005    Cho et al.

*Primary Examiner*—W. David Coleman
*Assistant Examiner*—Sonya D McCall-Shepard
(74) *Attorney, Agent, or Firm*—Townsend and Townsend and Crew LLP

(57) ABSTRACT

A method for manufacturing a semiconductor device includes forming a sacrificial layer for forming a lower electrode as an amorphous carbon layer in order to prevent collapsing of a cylindrical lower electrode. When an alignment process is not normally performed to arrange photoresist mask pattern for storage electrode and lower electrode contact plug due to optical absorbance of the amorphous carbon layer, a polysilicon layer is further formed over a SiON film used as a hard mask of the amorphous carbon layer, thereby reducing risk of misalignment and performing a stable process for forming a capacitor to increase yield of semiconductor devices.

9 Claims, 8 Drawing Sheets

METHOD FOR MANUFACTURING SEMICONDUCTOR DEVICE

CROSS-REFERENCES TO RELATED APPLICATIONS

The present application claims priority to Korean patent application number 10-2005-0135355, filed on Dec. 30, 2005, which is incorporated by reference in its entirety.

BACKGROUND OF THE INVENTION

The present invention relates to a semiconductor device, and more specifically to a method for manufacturing a capacitor in semiconductor device wherein the thin walls of the lower electrode of the capacitor can be protected from damage during etching without compromising the alignment process.

In general, a process for forming a capacitor is performed with an oxide film as a sacrificial layer for forming a lower electrode.

FIGS. 1a through 1e are cross-sectional diagrams illustrating a method for forming a lower electrode of a conventional capacitor.

Referring to FIG. 1a, an interlayer insulating film 10, including a lower electrode contact plug 20, is formed over a semiconductor substrate (not shown). Then, an etching stop film 30 and a sacrificial oxide film 40 for forming a lower electrode are formed over the interlayer insulating film 10. Next, a photoresist film pattern 70 for making the storage electrodes is formed over the sacrificial oxide film 40.

Referring to FIG. 1b, the sacrificial oxide film 40 and the etching stop film 30 are etched with the photoresist film pattern 70 as an etching mask to form the lower electrode region 80.

Referring to FIG. 1c, a lower electrode material 90 is formed over the entire surface of the semiconductor substrate including the lower electrode region 80.

Referring to FIG. 1d, the lower electrode material 90 formed on the top surface of the sacrificial oxide film 40 is removed so that only one lower electrode 95 is connected to each lower electrode contact plug 20.

Referring to FIG. 1e, a wet etching method is performed to remove the sacrificial oxide film 40. After a dielectric layer (not shown) is formed over the surface of the lower electrode 95, a plate electrode layer (not shown) is formed over the entire surface of the semiconductor substrate to complete the capacitor. However, the lower electrode 95 can collapse during the wet etching process of the sacrificial oxide film 40.

The use of an amorphous carbon layer can prevent the collapse of the lower electrode 95. However, amorphous carbon has high optical absorbance that can impede the alignment process of the lower electrode contact plugs and the photoresist film pattern.

FIG. 2 is a cross-sectional diagram illustrating an alignment mark when an oxide film is used as a sacrificial layer.

Referring to FIG. 2, an alignment mark 35 and a predetermined number of alignment keys 25 are formed in an outer region of a semiconductor substrate. Here, the alignment key 25 is formed over the interlayer insulating film 10, and the etching stop film 30 and the sacrificial oxide film 40 are deposited thereon.

Thereafter, light is irradiated into the alignment key 25 to perform an alignment process using the diffracted light so that the lower electrode contact plug and the photoresist film pattern are aligned. Here, light is easily penetrated and diffracted in the sacrificial oxide film and the etching stop film because they have low optical absorbance. As a result, it is easy to perform the alignment process. However, when the sacrificial oxide film is substituted with the amorphous carbon layer, light does not pass through (or is diffracted) but gets absorbed in the amorphous carbon layer. As a result, it is difficult to perform the alignment process.

FIG. 3 is a cross-sectional diagram illustrating an alignment process when an amorphous carbon layer is used as a sacrificial layer.

Referring to FIG. 3, the sacrificial oxide film of FIG. 2 is substituted with the amorphous carbon layer 45 and an alignment mark is formed, then a hard mask SiON film 50 is formed over the amorphous carbon layer 45. In this case, although the SiON film has low optical absorbance, the amorphous carbon layer 45 has high optical absorbance. As a result, much of the light is absorbed by the amorphous carbon layer 45 and a very little amount of light passes through the amorphous carbon layer 45. This makes it difficult to perform an accurate alignment process, particularly during the process of forming capacitors.

SUMMARY OF THE INVENTION

Various embodiments are directed at providing a method for manufacturing a capacitor in a semiconductor device with an amorphous carbon layer as a sacrificial layer for forming a lower electrode while providing a method to perform an alignment process.

In one embodiment, a method for manufacturing a semiconductor device includes providing a semiconductor substrate defining an active region and a peripheral region. The substrate has an insulating layer and a lower electrode contact plug provided in the active region. The lower electrode contact plug is defined within the insulating layer. A first alignment mark is formed in the peripheral region. An amorphous carbon layer is formed over the insulating layer and the lower electrode contact plug in the active region and the first alignment mark in the peripheral region. A polysilicon layer is formed over the amorphous carbon layer in the active region and the peripheral region. The polysilicon layer has first and second portions, the first portion being associated with the active region and the second portion being associated with the peripheral region. The second portion defines a second alignment mark corresponding to the first alignment mark. A mask pattern is formed over the first portion of the polysilicon layer to define a storage electrode region that is aligned to the lower electrode contact plug. The first portion of the polysilicon layer and the amorphous carbon layer are etched to form a trench over the lower electrode contact plug. A lower electrode material is formed within the trench and over the lower electrode contact plug. An upper portion of the lower electrode material is etched to form a lower electrode of a capacitor. The amorphous carbon layer in the active region is removed. The lower electrode of the capacitor is in contact with the lower electrode contact plug.

In one embodiment, the method includes forming an etch stop film over the insulating layer, the etch stop film being between the insulating layer and the amorphous carbon layer. The trench exposes the etch stop layer. The etch stop layer is etched using an etch step that is different from that used to etch the amorphous carbon layer.

In one embodiment, the second alignment mark is used to form the mask pattern in the active region, so that the storage electrode region is properly aligned to the lower electrode contact plug.

According to an embodiment of the present invention, a method for manufacturing a semiconductor device includes:

(a) forming an interlayer insulating film including a lower electrode contact plug over a semiconductor substrate;

(b) forming an etching stop film over the interlayer insulating film;

(c) forming an amorphous carbon layer for forming the lower electrode of a capacitor over the etching stop film;

(d) sequentially forming a hard mask SiON film and a polysilicon layer over the amorphous carbon layer;

(e) forming a photoresist film pattern defining the storage electrode region over the polysilicon layer and sequentially etching the polysilicon layer, the SiON film, the amorphous carbon layer and the etching stop film using the photoresist film pattern as an etching mask to form a lower electrode region exposing the lower electrode contact plug; and (f) forming a lower electrode material on the surface of the lower electrode region and removing the amorphous carbon layer.

According to another embodiment of the present invention, a method for manufacturing a semiconductor device including forming a capacitor using an amorphous carbon layer includes:

forming an alignment key in an alignment mark region of a semiconductor substrate by a process for forming a lower electrode contact plug of a capacitor;

forming an etching stop film for lower electrodes over the entire surface of the semiconductor substrate, including the alignment key;

forming an amorphous carbon layer, for forming the lower electrode of a capacitor, over the etching stop film;

forming a hard mask SiON film over the amorphous carbon layer; and forming a polysilicon layer over the hard mask SiON film, wherein an alignment mark is formed at the polysilicon layer through a step difference of the alignment key.

DESCRIPTION OF SPECIFIC EMBODIMENTS

Figure 1A:
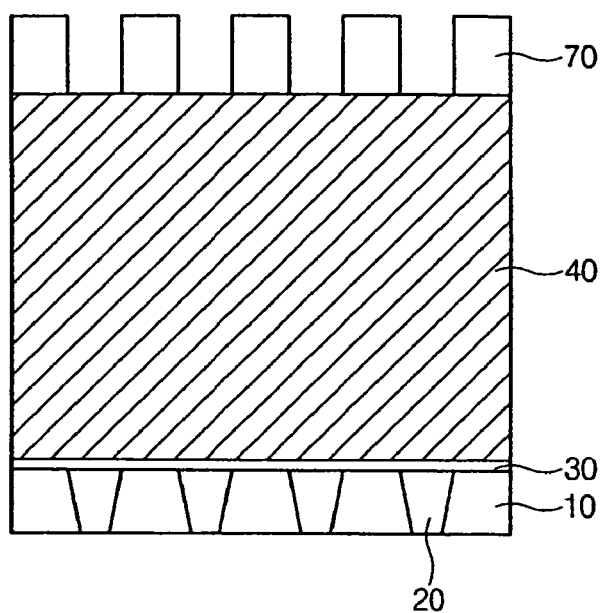
FIGS. 1a through 1e are cross-sectional diagrams illustrating a method for forming a lower electrode of a conventional capacitor.
Figure 1B:
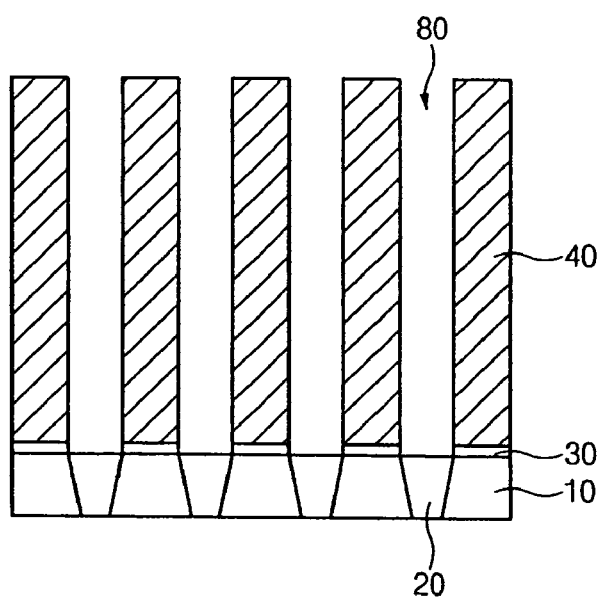
Figure 1C:
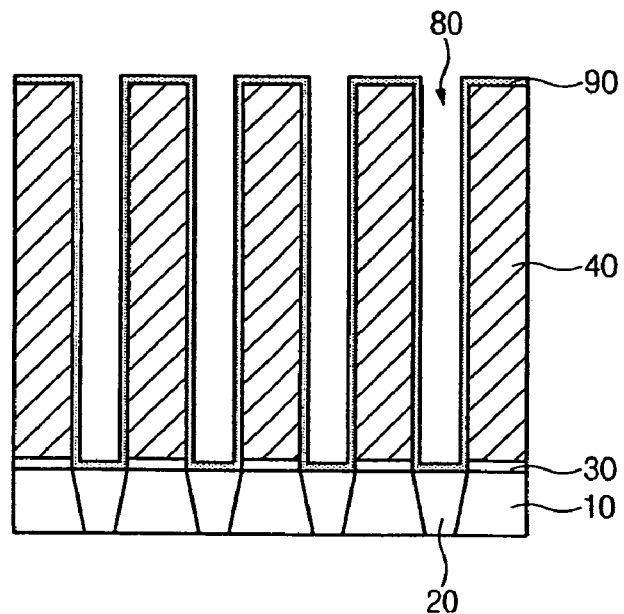
Figure 1D:
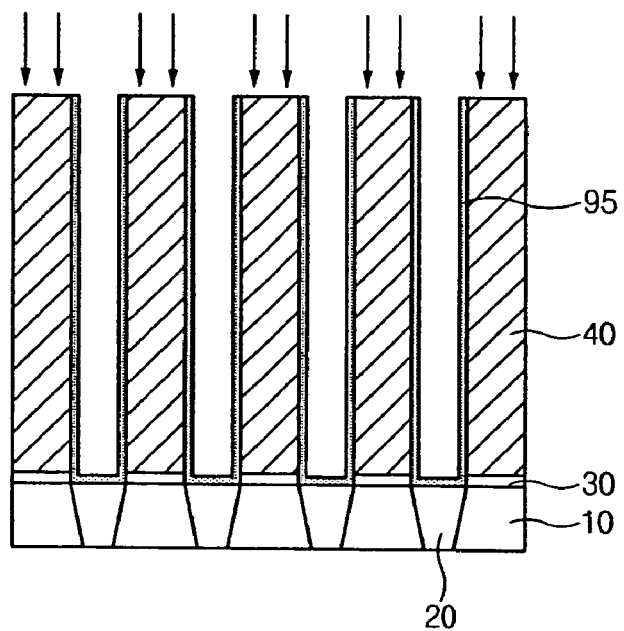
Figure 1E:
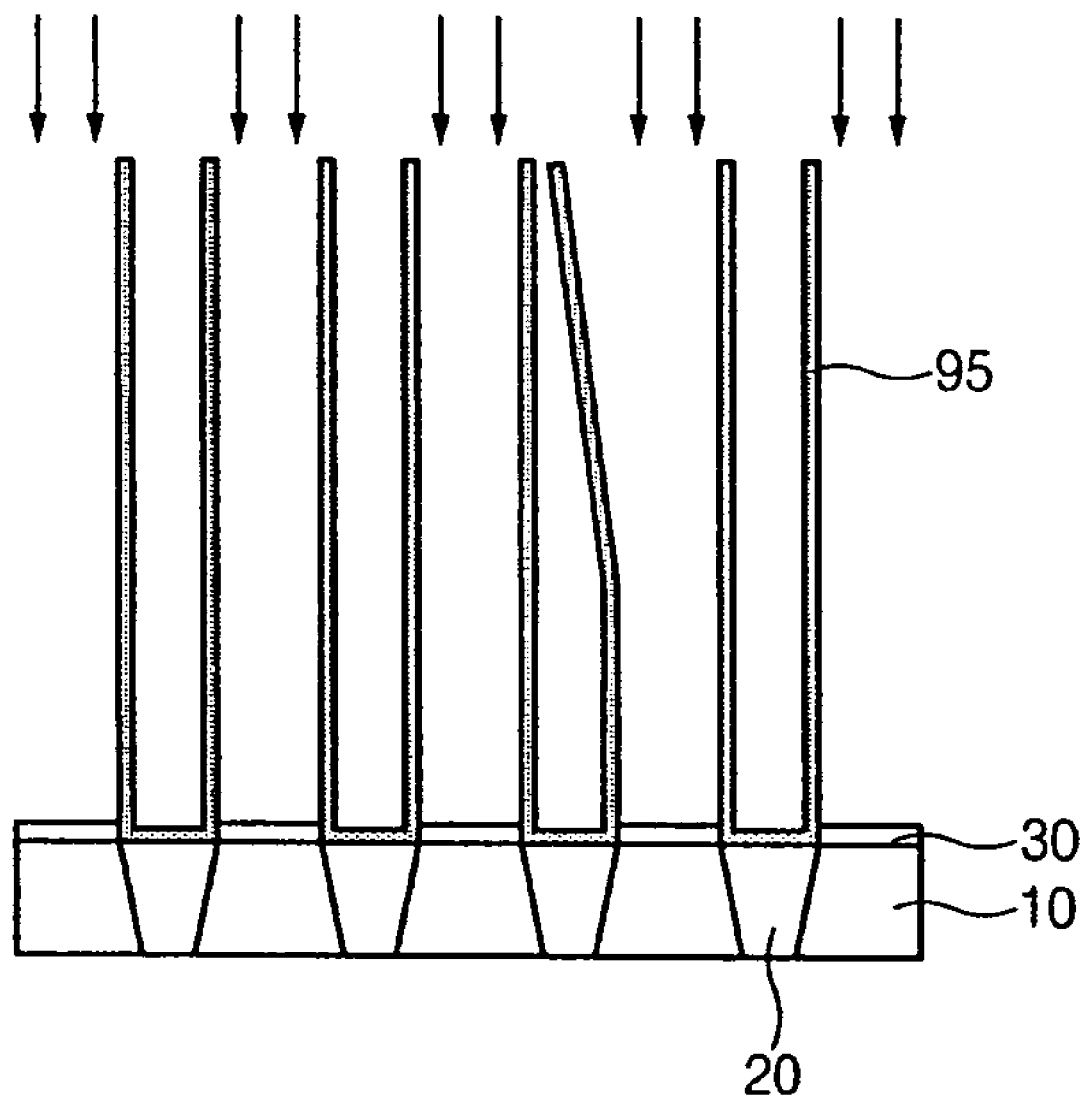
Figure 2:
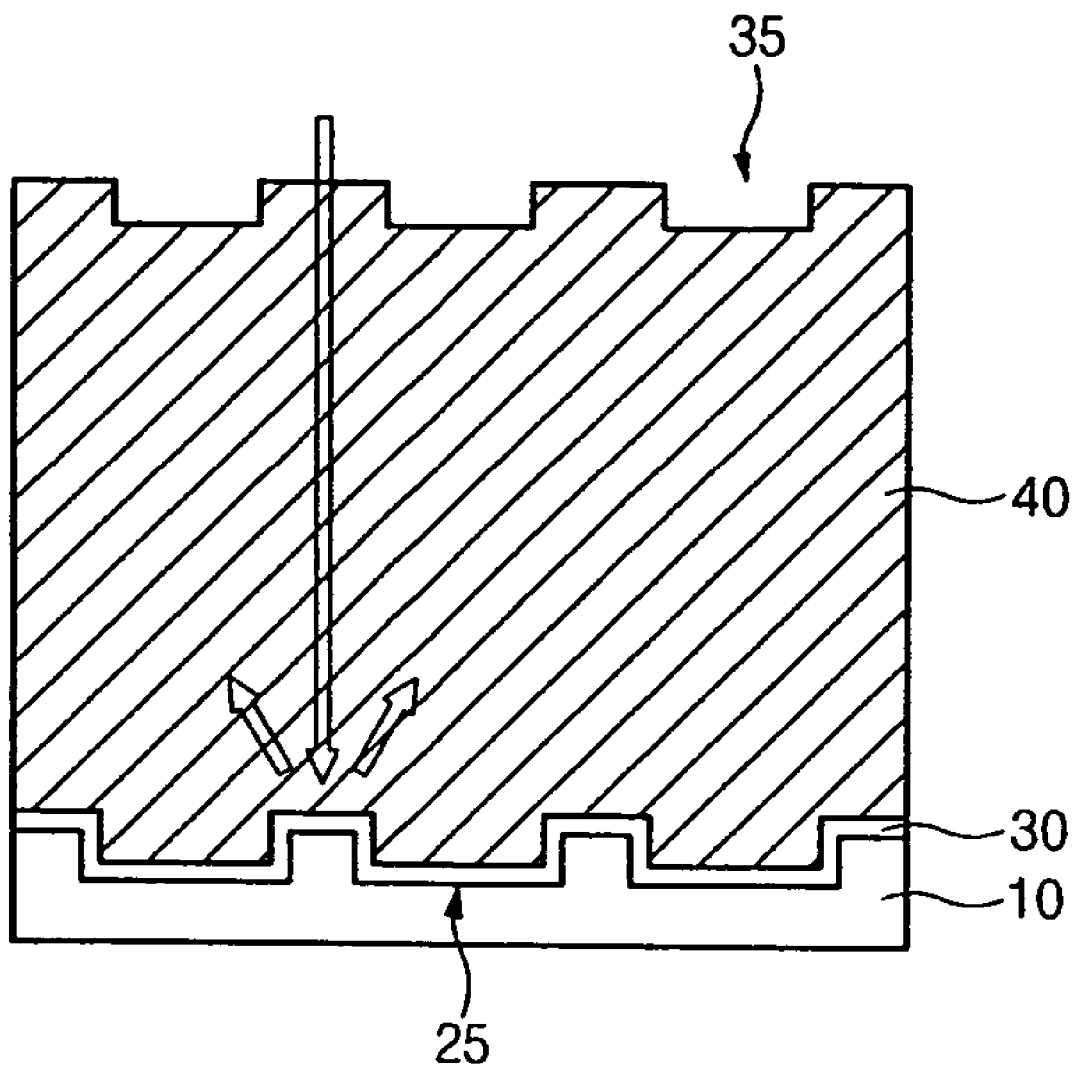
FIG. 2 is a cross-sectional diagram illustrating an alignment mark when an oxide film is used as a sacrificial layer.
Figure 3:
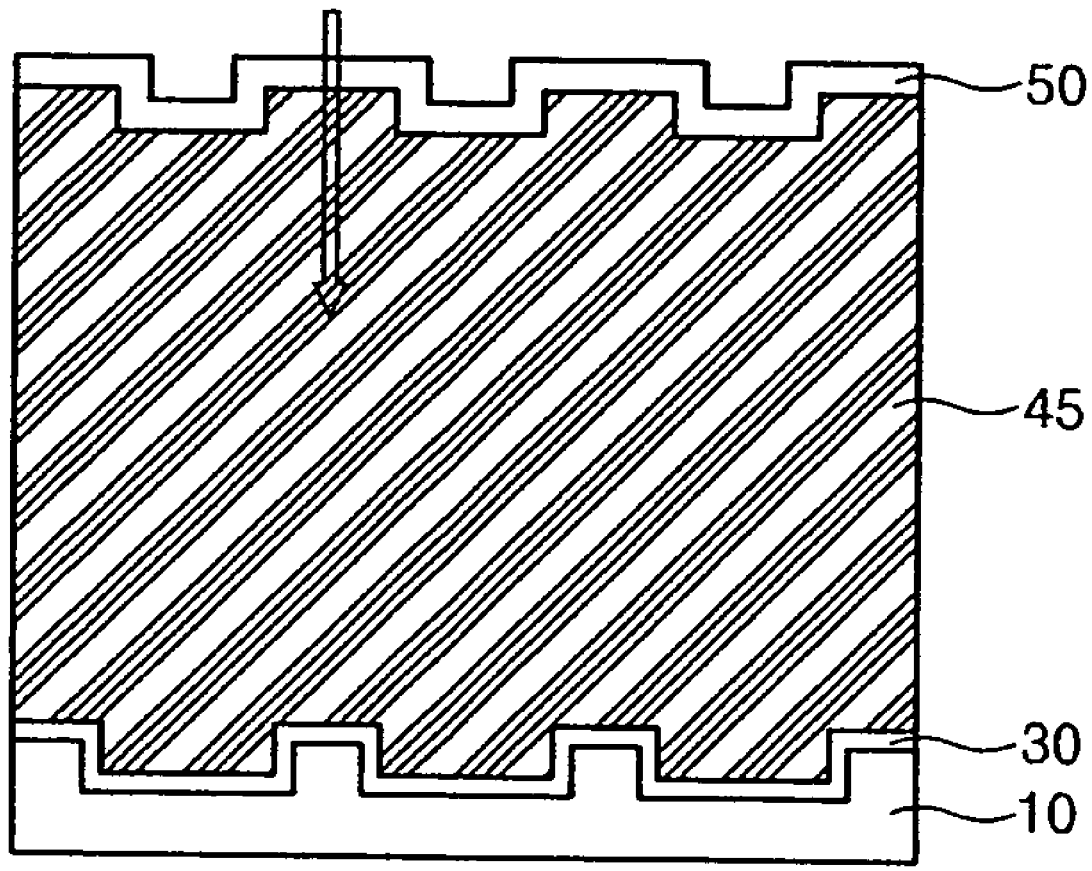
FIG. 3 is a cross-sectional diagram illustrating an alignment mark when an amorphous carbon layer is used as a sacrificial layer.
Figure 4A:
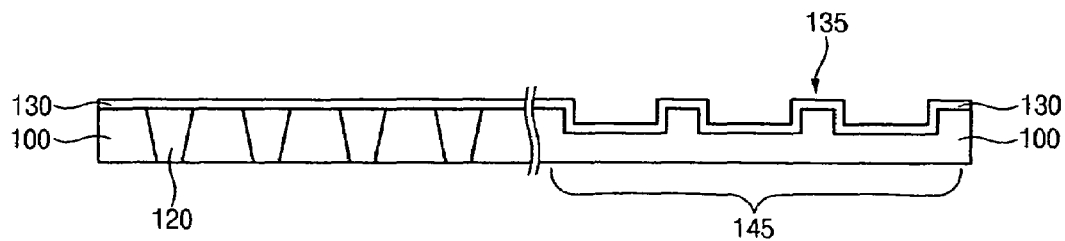
FIGS. 4a through 4f are cross-sectional diagrams illustrating a method for manufacturing a semiconductor device according to an embodiment of the present invention.

Referring to FIG. 4a, an interlayer insulating film 100 including a lower electrode contact plug 120 is formed over a semiconductor substrate (not shown). The interlayer insulating film 100 is formed over the surface of the semiconductor substrate including a gate and source/drain regions. Then the lower electrode contact plug 120 is selectively etched to form a lower electrode contact hole between the gates, and a plug material is filled in the lower electrode contact hole. As a result, the lower electrode contact plug 120 is formed.

A first alignment mark 145 is formed in an outer region (or peripheral region) of the semiconductor substrate to align a lower electrode mark pattern and a lower electrode contact plug during a subsequent process for forming a capacitor lower electrode. An alignment key 135 is formed in the outer region of the semiconductor substrate, for selectively etching the interlayer insulating film 100, for forming a lower electrode contact hole during a process, and for forming a lower electrode contact plug 120. An etching stop film 130 is formed over the interlayer insulating film 100.

Figure 4B:
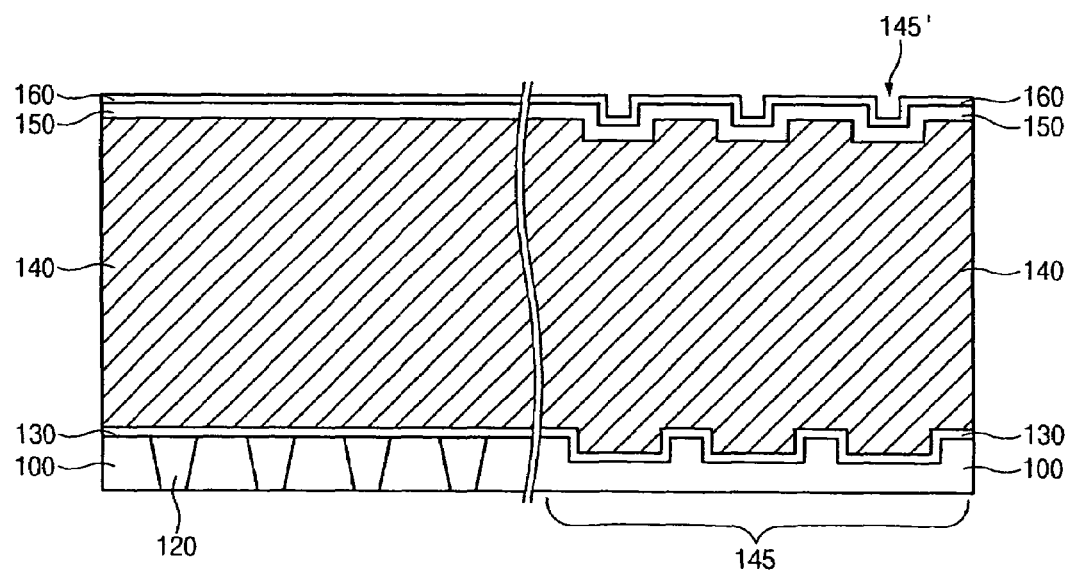

Referring to FIG. 4b, an amorphous carbon layer 140, for forming a lower electrode of a capacitor, is formed over the etching stop film 130, and then a hard mask SiON film 150 and a polysilicon layer 160 are sequentially formed over the amorphous carbon layer 140. Here, the etching stop film 130 includes a nitride film having a thickness ranging from about 300 Å to 600 Å. The amorphous carbon layer 140 is formed at a thickness ranging from about 20,000 Å to 25,000 Å. The SiON film 150 is formed at a thickness ranging from about 2,000 Å to 2,500 Å. The polysilicon layer 160 is formed at a thickness ranging from about 1,000 Å to 1,500 Å.

The etching stop film 130, the amorphous carbon layer 140, the hard mask SiON film 150 and the polysilicon layer 160 are deposited over the alignment mark 145 so that a second alignment mark 145' is duplicated on the polysilicon layer 160 through a step difference of the alignment key 135 shown in FIG. 4a.

Accordingly, the polysilicon layer 160 has a first portion that is substantially planar and a second portion that has patterns. The first portion is provided in the active region where the capacitors will be formed. The second portion is provided in the peripheral region where the alignment mark is formed.

Figure 4C:
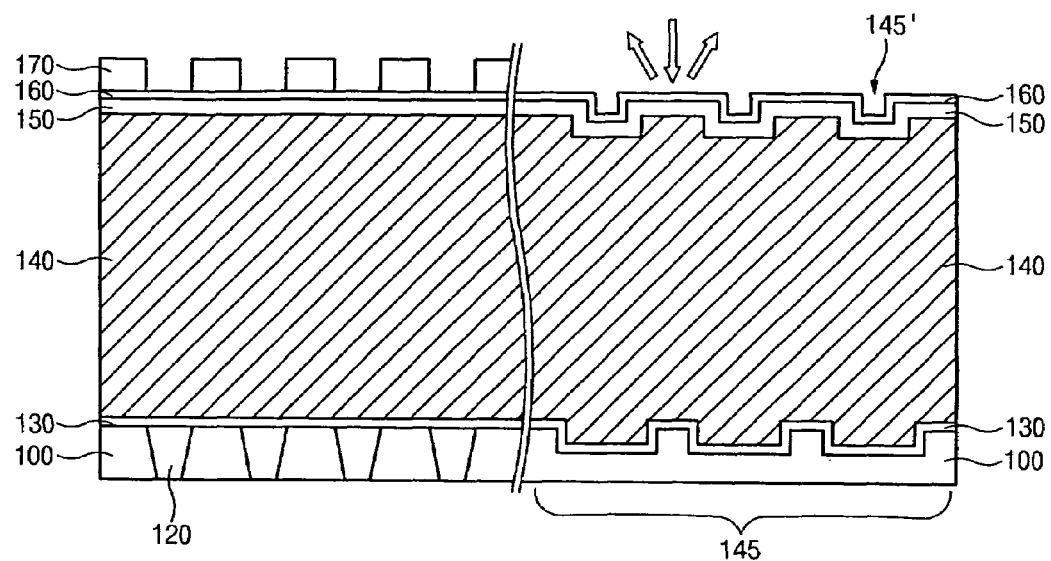

Referring to FIG. 4c, an alignment process is performed with the second alignment mark 145' formed in FIG. 4b, and a photoresist film pattern 170 for storage electrode is formed over the polysilicon layer 160 of a capacitor region (e.g., in the active region).

Since the polysilicon layer 160 is a good light reflective material, the light used in the alignment process is reflected so that the alignment process can be easily performed. As a result, the use of the polysilicon layer 160 prevents misalignment of the photoresist film pattern 170 with the lower electrode contact plug 120. A subsequent etching process for forming a lower electrode region can be performed more accurately.

Figure 4D:
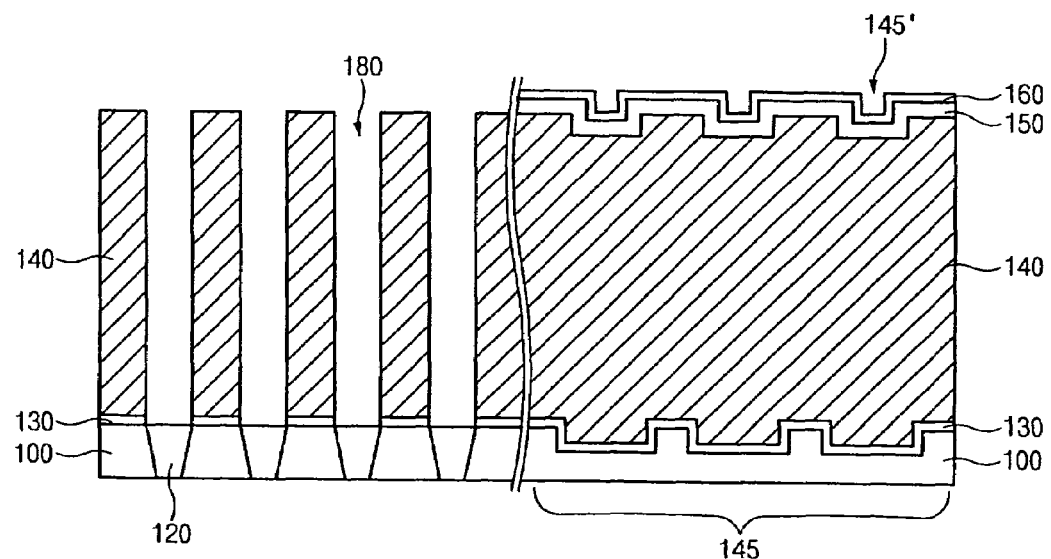

Referring to FIG. 4d, the polysilicon layer 160, the SiON film 150, the amorphous carbon layer 140 and the etching stop film 130 are sequentially etched to form a lower electrode region 180 which exposes the lower electrode contact plug 120.

Figure 4E:
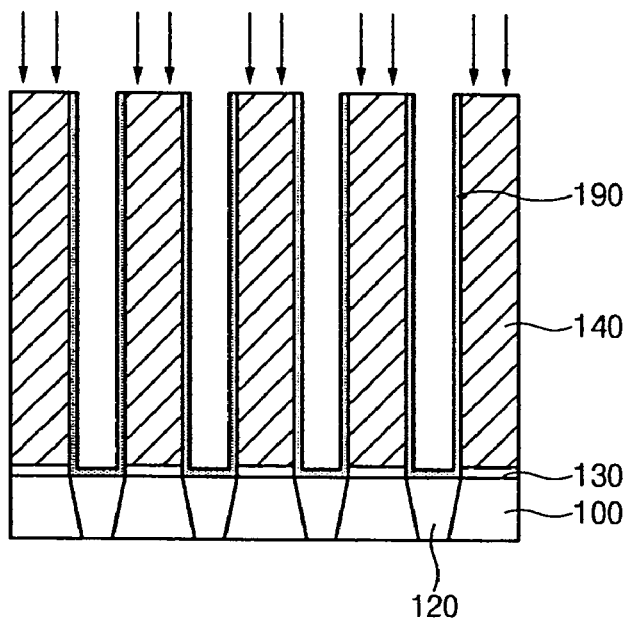

Referring to FIG. 4e, a lower electrode material 190 is formed over the surface of the lower electrode region 180. The upper portion of lower electrode material 190 provided on the amorphous carbon layer 140 is etched.

Figure 4F:
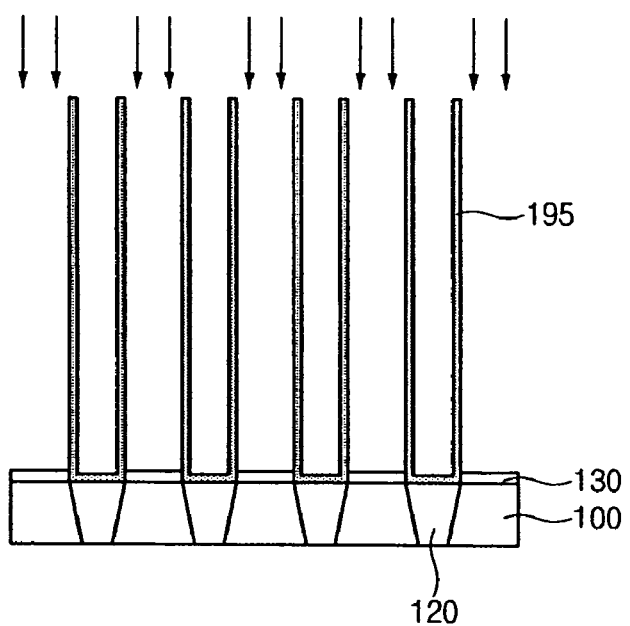

Referring to FIG. 4f, the amorphous carbon layer 140 is removed and a lower electrode 195 is formed. The lower electrode 195 is cylindrical in the present embodiment. A dry etching method is used to remove the amorphous carbon layer 140 in the present embodiment.

As described above, in a method for manufacturing a semiconductor device according to an embodiment of the present invention, an amorphous carbon layer is used as a sacrificial layer for forming a lower electrode in order to prevent collapsing of a lower electrode. When an alignment process is not normally performed to align photoresist film pattern for storage electrode and lower electrode contact plug due to optical absorbance of the amorphous carbon layer, a polysilicon layer is further formed over a SiON film used as a hard mask of the amorphous carbon layer, thereby reducing risk of misalignment and performing a stable process for forming a capacitor to increase yield of semiconductor devices.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a semiconductor device, the method comprising:
   providing a semiconductor substrate defining an active region and a peripheral region, the substrate having an insulating layer and a lower electrode contact plug provided in the active region, the lower electrode contact plug being defined within the insulating layer;
   forming a first alignment mark in the peripheral region;
   forming an amorphous carbon layer over the insulating layer and the lower electrode contact plug in the active region and the first alignment mark in the peripheral region;
   forming a polysilicon layer over the amorphous carbon layer in the active region and the peripheral region, the polysilicon layer having first and second portions, the first portion being associated with the active region and the second portion being associated with the peripheral region, the second portion defining a second alignment mark corresponding to the first alignment mark;
   forming a mask pattern over the first portion of the polysilicon layer to define a storage electrode region that is aligned to the lower electrode contact plug;
   etching the first portion of the polysilicon layer and the amorphous carbon layer using the mask pattern to form a trench over the lower electrode contact plug;
   forming a lower electrode material within the trench and over the lower electrode contact plug;
   etching an upper portion of the lower electrode material to form a lower electrode of a capacitor; and
   removing the amorphous carbon layer in the active region, wherein the lower electrode of the capacitor is in contact with the lower electrode contact plug.

2. The method of claim 1, further comprising:
   forming an etch stop film over the insulating layer, the etch stop film being between the insulating layer and the amorphous carbon layer, wherein the trench exposes the etch stop film; and
   etching the etch stop film to expose the lower electrode contact plug using an etch step that is different that used to etch the amorphous carbon layer.

3. The method according to claim 2, wherein the etch stop film includes a nitride film having a thickness of about 300 Å to about 600 Å.

4. The method according to claim 2, wherein the amorphous carbon layer is formed to have a thickness ranging from about 20,000 Å to about 25,000 Å.

5. The method according to claim 1, further comprising:
   forming a SiON film over the amorphous carbon layer to a thickness ranging from about 2,000 Å to about 2,500 Å, the SiON film being provided between the amorphous carbon layer and the polysilicon layer.

6. The method according to claim 1, wherein the polysilicon layer is formed at a thickness ranging from about 1,000 Å to about 1,500 Å.

7. The method according to claim 1, wherein the amorphous carbon layer is removed using a dry etch step.

8. The method of claim 1, wherein the second alignment mark is used to form the mask pattern in the active region, so that the storage electrode region is properly aligned to the lower electrode contact plug.

9. The method of claim 8, wherein the mask pattern is a photoresist pattern.

* * * * *